(12) United States Patent
Doan et al.

(10) Patent No.: US 6,582,281 B2
(45) Date of Patent: Jun. 24, 2003

(54) SEMICONDUCTOR PROCESSING METHODS OF REMOVING CONDUCTIVE MATERIAL

(75) Inventors: Trung Tri Doan; Scott G. Meikle, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/534,820

(22) Filed: Mar. 23, 2000

(65) Prior Publication Data

US 2002/0061714 A1 May 23, 2002

(51) Int. Cl.[7] .................................................. B24B 1/00
(52) U.S. Cl. ............................ 451/41; 451/60; 451/287
(58) Field of Search ............................... 451/41, 60, 5, 451/285–289, 446, 93, 36, 37, 39

(56) References Cited

U.S. PATENT DOCUMENTS

| | | | |
|---|---|---|---|
| 4,839,005 A | 6/1989 | Katsumoto et al. | 205/663 |
| 5,096,550 A | 3/1992 | Mayer et al. | 204/129.1 |
| 5,807,165 A | 9/1998 | Uzoh et al. | 451/41 |
| 5,911,619 A | 6/1999 | Uzoh et al. | 451/5 |
| 5,920,169 A * | 7/1999 | Hamamura et al. | 318/561 |
| 5,927,124 A * | 7/1999 | Webster | 72/131 |
| 6,034,498 A * | 3/2000 | Hamamura et al. | 318/280 |
| 6,048,140 A * | 4/2000 | Johnson | 407/113 |
| 6,147,468 A * | 11/2000 | Hamamura et al. | 318/569 |
| 6,234,870 B1 | 5/2001 | Uzoh et al. | 451/8 |
| 6,250,994 B1 * | 6/2001 | Chopra et al. | 451/56 |

FOREIGN PATENT DOCUMENTS

| | | | |
|---|---|---|---|
| JP | 60 186318 | 9/1985 | |
| WO | WO 98/26453 A1 * | 6/1998 | H01L/23/498 |
| WO | PCT/US01/40358 | 3/2001 | |

* cited by examiner

*Primary Examiner*—Joseph J. Hail, III
*Assistant Examiner*—David B. Thomas
(74) *Attorney, Agent, or Firm*—Wells St. John P.S.

(57) ABSTRACT

The invention includes a semiconductive processing method of electrochemical-mechanical removing at least some of a conductive material from over a surface of a semiconductor substrate. A cathode is provided at a first location of the wafer, and an anode is provided at a second location of the wafer. The conductive material is polished with the polishing pad polishing surface. The polishing occurs at a region of the conductive material and not at another region. The region where the polishing occurs is defined as a polishing operation location. The polishing operation location is displaced across the surface of the substrate from said second location of the substrate toward said first location of the substrate. The polishing operation location is not displaced from said first location toward said second location when the polishing operation location is between the first and second locations. The invention also includes a semiconductor processing method of removing at least some of a conductive material from over a surface of a semiconductive material wafer. A polishing pad is displaced across an upper surface of the wafer from a central region of the wafer toward a periphery of the wafer, and is not displaced from the periphery to the central region.

38 Claims, 2 Drawing Sheets

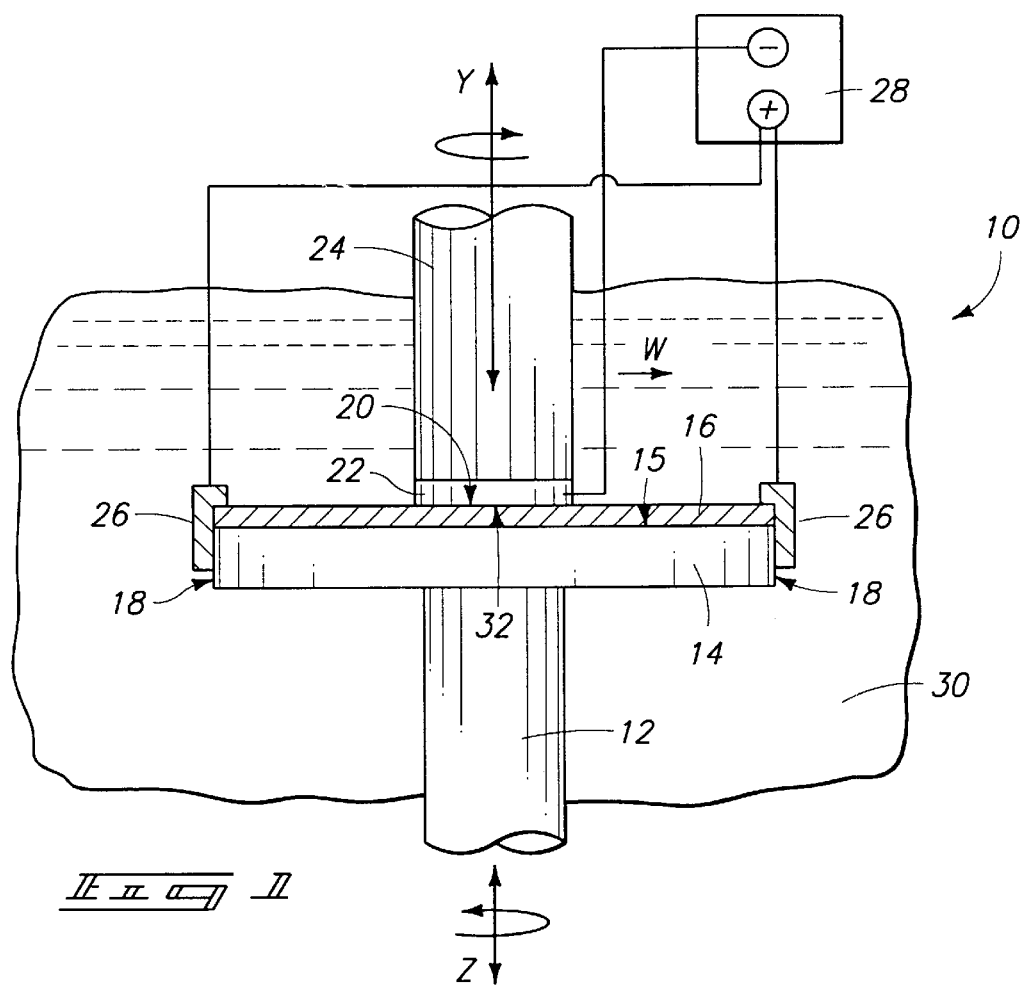
_Fig. 1_
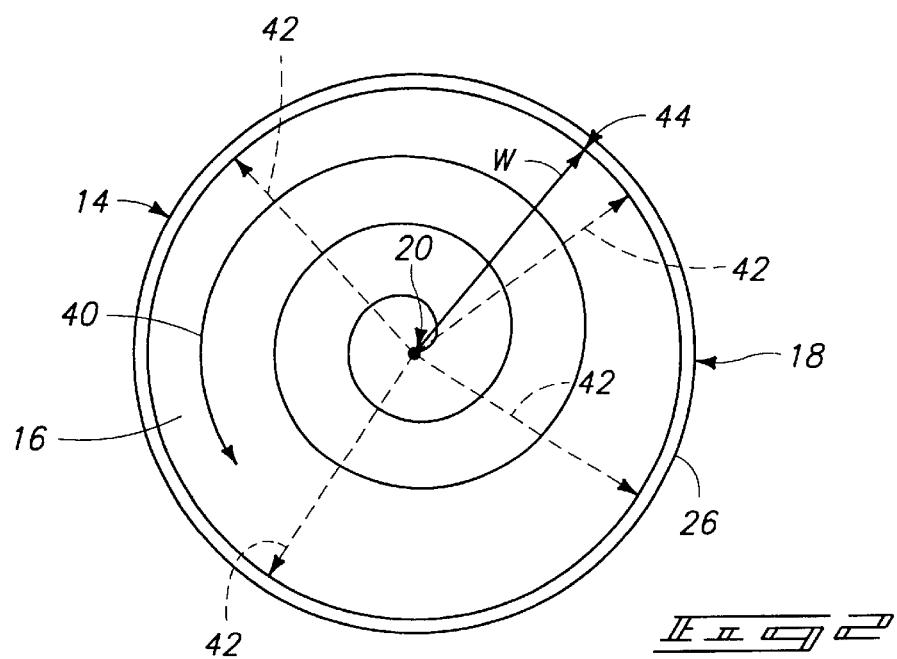
_Fig. 2_

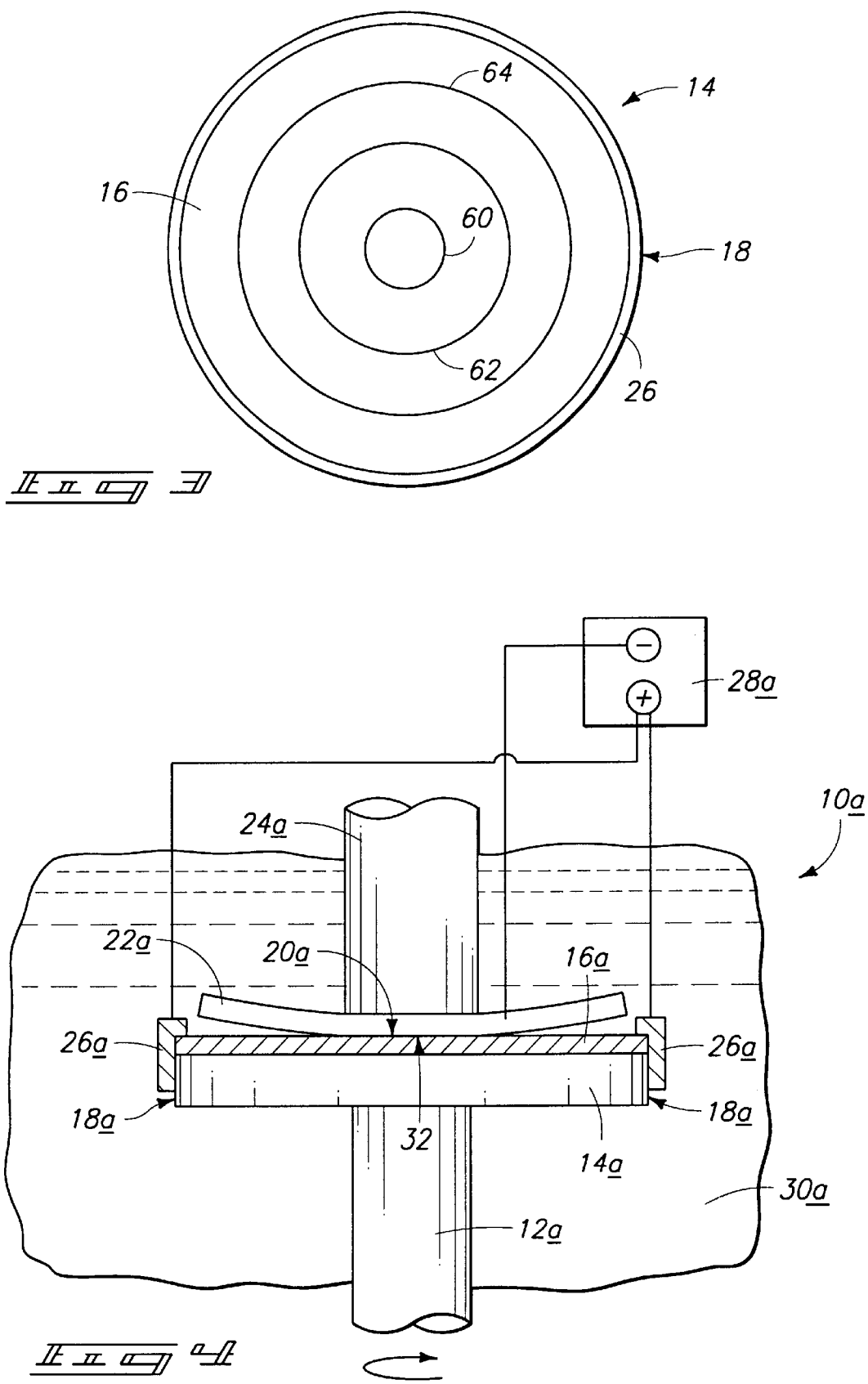

ined with US 6,582,281 B2

SEMICONDUCTOR PROCESSING METHODS OF REMOVING CONDUCTIVE MATERIAL

TECHNICAL FIELD

The invention pertains to semiconductor processing methods of removing conductive material.

BACKGROUND OF THE INVENTION

Conductive materials are frequently formed over semiconductive materials during fabrication of semiconductor chips. In typical processing, a circular wafer of semiconductive material is processed to have one or more thin conductive layers formed thereover. The conductive layers can comprise, for example, metal (such as, for example, copper, aluminum, titanium, tantalum, iron, silver, gold, etc.) or other conductive materials (such as, for example, conductively doped polysilicon). The conductive materials can be subsequently planarized by, for example, electrochemical-mechanical planarization. In electrochemical-mechanical planarization, the conductive material is exposed to an electrical circuit which causes at least some of the conductive material to be electrochemically removed and the material is simultaneously exposed to polishing conditions. The polishing conditions enhance removal of the conductive material and planarize a surface of any remaining conductive material. The polishing can be accomplished by, for example, abrasively removing the conductive material with a polishing pad and polishing slurry.

A difficulty associated with electrochemical-mechanical planarization processes can occur in attempting to maintain a circuit through a conductive material during a simultaneous electrochemical removal and polishing process. It is typical to utilize some portions of the conductive material for carrying current to other portions during the electrochemical removal. For instance, peripheral edges of the conductive material can be connected to a cathode terminal of a power source, a polishing pad connected to an anode terminal of the power source, and the conductive material utilized to complete a circuit between the anode and cathode terminals. A problem which can occur as portions of the conductive material are removed is that such can break an electrical connection to other portions of the conductive material. The breakage of the electrical connection can slow or stop electrochemical removal of such other portions of the conductive material.

In particularly problematic instances, some portions of conductive material will be entirely removed from around other portions of conductive material to leave such other portions as islands surrounded by electrically insulative materials. Such islands will thus have no electrical connection between the anode and cathode, and will not be subjected to electrochemical removal conditions. Accordingly, the removal of the islands will occur entirely through mechanical polishing and will be slowed relative to removal of conductive materials exposed to both electrochemical removal and mechanical polishing. Accordingly, there will be non-homogeneous removal of conductive materials from over a surface of a wafer.

It would be desirable to develop methods of electrochemical removal that avoided some or all of the above-discussed problems.

SUMMARY OF THE INVENTION

In one aspect, the invention encompasses a semiconductive processing method of electrochemical-mechanical removing at least some of a conductive material from over a surface of a semiconductor substrate. A cathode is provided at a first location of the wafer, and an anode is provided at a second location of the wafer. The conductive material is polished with a polishing pad polishing surface. The polishing occurs at a region of the conductive material and not at another region. The region where the polishing occurs is defined as a polishing operation location. The polishing operation location is displaced across the surface of the substrate from said second location of the substrate toward said first location of the substrate. The polishing operation location is not displaced from said first location toward said second location when the polishing operation location is between the first and second locations.

In another aspect, the invention encompasses a semiconductor processing method of removing at least some of a conductive material from over a surface of a semiconductive material wafer. A polishing pad is displaced across an upper surface of the wafer from a central region of the wafer toward a periphery of the wafer, and is not displaced from the periphery to the central region.

In yet another aspect, the invention encompasses a method of electrochemically removing at least some of a conductive material from over a surface of a circular semiconductive material wafer which comprises radially displacing a polishing pad across the surface of the wafer. The radial displacing occurs only outwardly from a central region of the wafer and not inwardly toward the central region.

BRIEF DESCRIPTION OF THE DRAWINGS

Preferred embodiments of the invention are described below with reference to the following accompanying drawings.

FIG. 1 is a diagrammatic, fragmentary, cross-sectional sideview of an apparatus utilized in accordance with a method of the present invention.

FIG. 2 is a diagrammatic top view of a semiconductive material wafer processed in accordance with a method of the present invention.

FIG. 3 is a diagrammatic top view of a semiconductive material wafer processed in accordance with a method of the present invention and shown alternatively to the view of FIG. 2.

FIG. 4 is a diagrammatic, fragmentary, cross-sectional sideview of an apparatus utilized for processing a semiconductive material wafer in accordance with a second embodiment method of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A process of the present invention is described with reference to apparatus 10 of FIG. 1. Apparatus 10 comprises a support structure 12 having a semiconductor substrate 14 supported thereby. Substrate 14 can comprise, for example, a monocrystalline silicon wafer. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 14 has an upper surface 15. Such surface can comprise, for example, a surface of a semiconductive material wafer, or can comprise a surface of a material formed over a semiconductive material wafer. For instance, surface 15 can comprise a surface of an insulative material formed over a stack of circuit devices associated with a semiconductive material wafer.

A conductive material 16 is formed over upper surface 15 of substrate 14. Conductive material 16 can comprise, for example, a metal and/or conductively-doped silicon.

Substrate 14 has an outer peripheral edge 18 and a central inner region 20. A polishing pad 22 is provided over central region 20 of substrate 14. Polishing pad 22 is sized to extend over only a central portion of conductive material 16, and to leave peripheral portions uncovered. Polishing pad 22 is supported by a support structure 24 which is configured to enable rotation of pad 22 about an axis "Y".

Electrical connections 26 are provided along outer periphery 18 of substrate 14 and electrically contact conductive material 16. Electrical connections 26 are connected to a power source 28 which is also connected to polishing pad 22. Power source 28 forms a circuit which extends between polishing pad 22 and electrical connections 26 through conductive material 16, and which utilizes polishing pad 22 as an anode and connections 26 as a cathode. An electrolytic bath 30 is provided over conductive material 16 and between polishing bath 22 and electrical connections 26 to complete the electrical circuit. Electrolytic bath 30 can comprise, for example, an aqueous solution having salts dissolved therein. Bath 30 can also comprises abrasive particles for utilization as polishing slurry during polishing of conductive material 16 with polishing pad 22.

Although the embodiment of FIG. 1 shows electrolyte as being provided by a bath 30, it is to be understood that the electrolyte can be provided only over surface 16 by, for example, flowing a stream of electrolyte onto surface 16. Such stream could be flowed, for example, through a porous polishing pad 22, or alternatively through a tube provided over surface 16 and configured to allow the electrolyte to flow across surface 16 and under pad 22. Also, a polishing slurry could be provided by flowing a stream of slurry over surface 16, rather than as material within a bath.

Support 12 is configured to spin about an axis "Z" and to thereby spin substrate 14 and conductive material 16 relative to polishing pad 22. Polishing pad 22 comprises a surface 32 configured to abrasively remove material 16 as the surface is moved relative to material 16. In particular embodiments, the abrasive action of surface 32 results from interaction of surface 32 on a polishing slurry. In other embodiments, the abrasive action results from contact of surface 32 directly against material 16. Regardless of whether surface 32 contacts material 16 directly and/or through a polishing slurry, the spinning of material 16 relative to polishing pad 22 creates an abrasive action on material 16 which causes removal of at least some of material 16. Since polishing pad 22 is sized to extend over only a portion of conductive material 16, polishing surface 32 has a smaller surface area than does material 16.

Although both pad 22 and substrate 14 are shown being rotated, it is to be understood that the invention encompasses other embodiments wherein only one of pad 22 and substrate 14 is rotated. Also, although pad 22 is shown being rotated in a counter-rotary manner relative to the rotation of substrate 14, it is to be understood that the invention encompasses other embodiments wherein the pad and substrate rotate in a common direction relative to one another.

An electric current is provided within material 16 from power source 28 during the polishing of the material with pad 22. Such electric current causes electrochemical removal of conductive material 16, and thus enhances removal of material 16 relative to the removal which would occur by polishing action alone.

After at least some of conductive material 16 is removed from over central region 20 of substrate 14, pad 22 is displaced outwardly in direction "W" relative to substrate 14. Cathode 26 can be considered as being at a first location of substrate 14 and central region 20 can be considered a second location of substrate 14, and the displacement of pad 22 along direction "W" can thus be considered a movement of polishing surface 32 from the first location of substrate 14 toward the second location. Preferably, polishing pad 22 is displaced only from the second location toward the first location, and not in the reverse direction. In such preferred embodiment, conductive material 16 is removed from over a central location of substrate 14 prior to removing the conductive material from over outer regions of substrate 14. Thus, a circuit extending between cathode 26 and the anode of pad 22 through conductive material 16 can remain complete during removal of the conductive material 16. Specifically, since the inner (i.e., more central) portions of conductive material 16 are removed prior to removing outer portions of conductive material 16, and since pad 22 is not moved back over a more central region of conductive material 16 after removing an outer region of conductive material 16, a bridge of conductive material 16 can always remain between pad surface 32 and cathode 26 to maintain electrical conductivity between cathode 26 and pad surface 32 during removal of conductive material 16. Such can alleviate prior art problems discussed above in the "Background" section of this disclosure.

It is noted that although cathode 26 is shown at an outer periphery of substrate 14 and the anode is shown starting at a central region of substrate 14, the relative positions of the cathode and anode can be reversed. Also, it is noted that cathode 26 can be a single electrode extending entirely around a periphery of substrate 14, or can comprise a plurality of electrode segments spaced around periphery 18 of substrate 14. It is additionally noted that although polishing pad 22 is shown starting at a central location of substrate 14, it is to be understood that the polishing pad could start at a different location of substrate 14, provided that in a preferred embodiment the pad worked from the starting location toward the cathode, and was not worked back toward the starting location after it had left the starting location.

FIG. 2 shows a top view of substrate 14, and shows electrode 26 as a continuous electrode extending around substrate 14. FIG. 2 also shows an exemplary path 40 for polishing pad 22 (FIG. 1). The pad starts at about central region 20 and spirals outwardly from central region 20 toward periphery 18 of substrate 14. The shown substrate 14 is circular and has radii 42 extending outwardly from a central location. The spiral path of the polishing pad moves the pad only outwardly along radii 42, and not inwardly. In other words, the polishing pad is moved only from central location 20 outwardly toward periphery 18, and not inwardly back toward central location 20. A term "polishing operation location" is utilized in this document to refer to locations wherein polishing is actively occurring. The movement of polishing pad 22 moves the polishing operation locations across substrate 14 in the spiral pattern 40.

Direction "W" of FIG. 1 is shown in FIG. 2 to illustrate that the spiral path 40 causes the polishing pad to be always moving outward from central location 20 toward a point 44 on periphery 18 along direction "W" whenever the pad is between central location 20 and the location corresponding to point 44. It is also noted that when polishing pad 22 is not between location 20 and point 44, the pad does not move along direction "W", but instead moves in other directions which take the pad outwardly from central location 20 toward periphery 18. It is further noted that the spiral trajectory of path 40 defines concentric rings of travel of the polishing pad, with such concentric rings extending radially outward from central location 20.

The spiral pattern of FIG. 2 is but one pattern which can be utilized to progress polishing operation locations across a substrate surface. Another pattern which could be utilized is in the form of distinct rings 60, 62 and 64 shown in FIG. 3. Note that the more centrally occurring ring 60 would preferably be formed first, followed by ring 62, and lastly by the most outward ring 64. Note also that the polishing pad could remain in abrasive contact with a surface of conductive material 16 as the pad moves from one ring to another, or alternatively that the pad could be lifted from conductive material 16 during movement of the pad from one ring to another.

As was discussed above with reference to FIG. 1, one or both of a polishing pad and a wafer substrate can be rotated during displacement of the pad relative to the wafer substrate. It is to be understood that rotation of either the pad or the substrate is not the same as "displacement" within the present application. Specifically, the term "displacement" is defined to refer only to situations in which a polishing operation location is moved across a wafer surface, and not to situations wherein a polishing operation location remains at a same location over a wafer surface while a pad is being rotated or otherwise mechanically agitated. Also, it is to be understood that displacement can occur by moving either a substrate, a polishing pad, or both a substrate and a polishing pad, provided that the net result is movement of the substrate and/or pad relative to the other of the substrate and/or pad. Further, it is to be understood that displacement can occur without moving a polishing pad relative to a substrate, provided that a location of a polishing operation is moved relative to the substrate.

An exemplary apparatus in which a polishing operation location is displaced without displacement of a polishing pad is described with reference to FIG. 4. In referring to FIG. 4, similar numbering will be used as was utilized above in describing the apparatus of FIG. 1, with the suffix "a" used to indicate structures shown in FIG. 4.

FIG. 4 shows an apparatus 10a comprising a substrate holder 12a and a substrate 14a supported by holder 12a. A conductive material 16a is formed over substrate 14a and extends across an upper surface of substrate 14a. Substrate 14a has a central region 20a and a peripheral region 18a, and comprises at least one electrode 26a connected to conductive material 16a along periphery 18a. A flexible-material polishing pad 22a is provided over conductive material 16a. A narrow structure 24a (shown as a post) is provided over a location of pad 22a and pushes a region of pad 22a against conductive material 16a. Pad 22a is electrically connected to a power source 28a, which in turn is connected to electrode 26a.

In operation, post 24a is utilized to press a portion of large pad 22a against a region of conductive material 26a, and subsequently substrate 14a is rotated relative to pad 22a to cause abrasion of material 26a in a location pressed against pad 22a. Also, power source 28a is utilized to provide current through conductive material 16a during rotation of substrate 14a, and thus to facilitate electrochemical removal of material 16a in conjunction with the abrasive polishing.

Pad 22a can be supported by post 24a such that the pad and post are moved over conductive material 16a in, for example, a spiral pattern similar to that shown in FIG. 2. Alternatively, pad 22a can be separately supported so that the pad remains in a fixed location and post 24a is displaced over the pad to cause different portions of the pad to be pushed against spinning substrate 14a. Post 24a could be moved, for example, in a spiral pattern such as that shown in FIG. 2. In embodiments in which pad 22a remains stationary during the movement of post 24a, a location of a polishing operation is displaced relative to substrate 14a by displacement of post 24a, and without displacement of polishing pad 22a. The peripheral edges of pad 22a are shown raised relative to the center of pad 22a. Such configuration can be achieved by utilizing a pad material having an inherent flex of its peripheral edges relative to its center region, or by attaching one or more support structures (not shown) to the peripheral edges of the pad to raise the edges. Alternatively, the pad can be formed of a flexible material which lays flat across surface 16a, but which is in non-abrasive contact with the surface in regions which are not pressed between post 24a and surface 16a.

It is noted that in the above-described embodiments of FIGS. 1 and 4 only a portion of conductive material 16 is exposed to abrasive polishing at any given time during an electrochemical polishing process. Accordingly, some portions of a conductive material (16 or 16a) are in abrasive contact with a polishing pad (22 or 22a), and other portions are not in such abrasive contact during an electrochemical polishing process. As the polishing process progresses, the portions which had not been in abrasive contact become in abrasive contact while the portions that had been in abrasive contact are no longer in abrasive contact with the polishing pad. Preferably, once a portion progresses from being in abrasive contact with a polishing pad to not being in abrasive contact with the polishing pad, it is no longer exposed to electrochemical polishing conditions during the remainder of the electrochemical polishing process.

The above-described electrochemical polishing processes can be followed by conventional chemical-mechanical polishing processes to buff a substrate after the electrochemical polishing. The chemical-mechanical polishing comprises polishing with a polishing pad and slurry, and is not electrochemical polishing.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of electrochemical-mechanical removing at least some of a conductive material from over an upper surface of a semiconductor substrate comprising displacing a polishing operation location across the upper surface of the substrate from a central region of the substrate toward a periphery of the substrate and not displacing the polishing operation location from the periphery to the central region.

2. The method of claim 1 wherein the polishing operation location is defined by a location of a polishing pad relative to a surface of the substrate, and further comprising rotating the polishing pad separately from the displacement.

3. The method of claim 2 wherein an electrical circuit is provided through at least a portion of the conductive material during the removing, the circuit extending between at least one second electrical connection in electrical contact with a polishing surface of the polishing pad and at least one first electrical connection in direct electrical contact with conductive material only at the periphery.

4. The method of claim 2 wherein the displacing comprises moving the substrate relative to the polishing pad.

5. The method of claim 2 wherein the displacing comprises moving the polishing pad relative to the substrate.

6. The method of claim 2 wherein the displacing comprises moving both the polishing pad and the substrate.

7. The method of claim 1 further comprising, after the electrochemical-mechanical removing, chemical-mechanical polishing of the substrate utilizing a process that is not electrochemical-mechanical polishing.

8. A semiconductor processing method of electrochemical-mechanical removing at least some of a conductive material from over a surface of a circular semiconductive material wafer comprising radially displacing a polishing pad across the surface of the wafer, the radial displacing being only outwardly from a central region of the wafer and not inwardly toward the central region.

9. The method of claim 8 wherein the polishing pad is displaced circularly around the central region to define rings which progress increasingly outward toward a periphery of the wafer.

10. The method of claim 9 further comprising rotating the polishing pad separately from the displacement.

11. A semiconductor processing method of electrochemical-mechanical removing of at least some of a conductive material from over a surface of a semiconductor substrate comprising:

providing a substrate having a conductive material thereover;

providing a cathode at a first location of the substrate;

providing an anode at a second location of the substrate, the anode being associated with a polishing pad polishing surface;

polishing the conductive material with the polishing pad polishing surface, the polishing occurring at a region of the conductive material and not at another region, the region where the polishing occurs being defined as a polishing operation location; and displacing the polishing operation location across the surface of the substrate from said second location of the substrate toward said first location of the substrate, and not displacing the polishing operation location from said first location toward said second location when the polishing operation location is between the first and second locations.

12. The method of claim 11 wherein the second location is more centrally located on the substrate than the first location.

13. The method of claim 11 further comprising rotating at least one of the polishing pad and the substrate separately from the displacement.

14. The method of claim 11 wherein the polishing pad is pressed between a structure and the substrate, and wherein the displacing the polishing operation location comprises displacing the structure relative to the polishing pad.

15. The method of claim 11 wherein the polishing pad only covers a portion of the conductive material, and wherein the displacing the polishing operation location comprises displacing the polishing pad relative to the substrate.

16. The method of claim 15 wherein the displacing comprises moving the substrate relative to the polishing pad.

17. The method of claim 15 wherein the displacing comprises moving the polishing pad relative to the substrate.

18. The method of claim 15 wherein the displacing comprises moving both the polishing pad and the substrate.

19. A semiconductor processing method of removing conductive material, comprising:

providing a semiconductor wafer having a conductive material thereover, the wafer comprising an upper surface and an outer periphery around the upper surface, the conductive material extending across the upper surface of the wafer and to about the periphery;

electrochemically removing at least some of the conductive material with a polishing pad having a surface in abrasive contact with only a portion of the conductive material; and displacing the polishing pad across the upper surface of the wafer during the removing, the displacing being only from a central region of the wafer surface toward the periphery of the wafer.

20. The method of claim 19 wherein the polishing pad is displaced circularly around the central region to define rings which progress increasingly outward toward the periphery of the wafer.

21. The method of claim 19 further comprising rotating the polishing pad separately from the displacement.

22. The method of claim 19 wherein an electrical circuit is provided through at least a portion of the conductive material during the removing, the circuit extending between at least one second electrical connection in electrical contact with a polishing surface of the polishing pad and at least one first electrical connection in direct electrical contact with conductive material only at the periphery.

23. A semiconductor processing method of removing conductive material, comprising:

providing a semiconductor wafer having a conductive material thereover, the wafer comprising an upper surface and an outer periphery around the upper surface, the conductive material extending across the upper surface of the wafer and to about the periphery;

electrochemically removing at least some of the conductive material with a polishing pad having a surface in abrasive contact with only a portion of the conductive material, the portion of the conductive material in abrasive contact with the surface being defined as polishing operation location, the polishing pad extending over the conductive material to cover more of the conductive material than the polishing operation location; and displacing the polishing operation location across the upper surface of the wafer during the removing, the displacing being only from a central region of the wafer surface toward the periphery of the wafer.

24. The method of claim 23 wherein the polishing operation location is displaced across the upper surface of the wafer without displacing the polishing pad.

25. The method of claim 23 wherein the polishing operation location is displaced circularly around the central region to define rings which progress increasingly outward toward the periphery of the wafer.

26. The method of claim 23 further comprising rotating the wafer separately from the displacement.

27. The method of claim 23 wherein an electrical circuit is provided through at least a portion of the conductive material during the removing, the circuit extending between at least one second electrical connection in electrical contact with a polishing surface of the polishing pad and at least one first electrical connection in direct electrical contact with conductive material only at the periphery.

28. A semiconductor processing method of removing conductive material, comprising:
   providing a semiconductor wafer having a conductive material thereover, the conductive material defining a surface area, the surface area having a first portion surrounded by a second portion;
   providing a polishing pad surface in abrasive contact with the first portion of the conductive material surface area and not in abrasive contact with the second portion of the conductive material surface area;
   providing a circuit that extends across at least some of the first portion of the conductive material surface area to the second portion;
      electrochemically removing at least some of the conductive material from the first portion of the surface area by polishing the first portion with the polishing pad while flowing current through the circuit;
      after electrochemically removing the at least some of the conductive material from the first portion, displacing the polishing pad relative to the wafer and electrochemically removing at least some of the conductive material from the second portion surrounding the first portion; and
      not electrochemically removing conductive material from the first portion after electrochemically removing conductive material from the second portion.

29. The method of claim 28 wherein the first portion of the conductive material surface area is more centrally located on the wafer surface than the second portion of the conductive material surface area.

30. The method of claim 28 further comprising rotating at least one of the polishing pad and the wafer separately from the displacement.

31. The method of claim 28 wherein the displacing comprises moving the wafer relative to the polishing pad.

32. The method of claim 28 wherein the displacing comprises moving the polishing pad relative to the wafer.

33. The method of claim 28 wherein the displacing comprises moving both the polishing pad and the wafer.

34. A semiconductor processing method of electrochemically removing conductive material, comprising:
   providing a semiconductor wafer having a conductive material thereover, the conductive material defining a first surface area, the first surface area having a central portion and an outer peripheral portion surrounding the central portion, the outer peripheral portion having an outermost edge;
   providing at least one first electrical contact in electrical connection with the outermost edge of only the outer peripheral portion of the conductive material;
   providing a polishing pad proximate the central portion of the conductive material, the polishing pad having a polishing surface, the polishing surface defining a second surface area, the second surface area being less than the first surface area;
   providing at least one second electrical contact in electrical connection with the polishing surface of the polishing pad, the first and second electrical contacts being in electrical connection through a power source and defining a circuit that extends through the conductive material;
      electrochemically removing at least some of the conductive material from the central portion by polishing the wafer with the polishing pad while flowing current through the circuit; and
      only after electrochemically removing at least some of the conductive material from the central portion, displacing the polishing pad relative to the wafer to provide the pad proximate the outer peripheral portion of the conductive material and utilizing the polishing pad to electrochemically remove at least some of the conductive material from the peripheral portion, but not displacing the polishing pad from the outer peripheral portion to the central portion.

35. The method of claim 34 wherein the displacing comprises moving the polishing pad circularly around the central region to define rings which progress increasingly outward toward the peripheral portion of the wafer.

36. The method of claim 34 wherein the displacing comprises moving the wafer relative to the polishing pad.

37. The method of claim 34 wherein the displacing comprises moving the polishing pad relative to the wafer.

38. The method of claim 34 wherein the displacing comprises moving both the polishing pad and the wafer.

* * * * *